United States Patent
Chen et al.

(10) Patent No.: US 8,526,261 B2
(45) Date of Patent: Sep. 3, 2013

(54) INTEGRATED CIRCUIT MEMORY POWER SUPPLY

(75) Inventors: Gregory Kengho Chen, Ann Arbor, MI (US); Dennis Michael Sylvester, Ann Arbor, MI (US); David Theodore Blaauw, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 257 days.

(21) Appl. No.: 12/379,821

(22) Filed: Mar. 2, 2009

(65) Prior Publication Data

US 2010/0220538 A1 Sep. 2, 2010

(51) Int. Cl.
 *G11C 5/14* (2006.01)
(52) U.S. Cl.
 USPC ............ 365/226; 365/154; 365/200; 365/201
(58) Field of Classification Search
 USPC ................... 365/226, 201, 200, 154
 See application file for complete search history.

(56) References Cited

U.S. PATENT DOCUMENTS

| | | | | |
|---|---|---|---|---|
| 4,942,556 A | * | 7/1990 | Sasaki et al. | 365/200 |
| 5,936,892 A | * | 8/1999 | Wendell | 365/189.03 |
| 6,385,081 B1 | * | 5/2002 | Shiomi | 365/154 |
| 6,667,917 B1 | * | 12/2003 | Templeton et al. | 365/201 |
| 7,394,708 B1 | * | 7/2008 | Vadi | 365/201 |
| 2002/0027801 A1 | * | 3/2002 | Shiomi | 365/154 |
| 2009/0010053 A1 | * | 1/2009 | Chiu et al. | 365/182 |

* cited by examiner

*Primary Examiner* — Pho M Luu
*Assistant Examiner* — Thao Bui
(74) *Attorney, Agent, or Firm* — Nixon & Vanderhye P.C.

(57) ABSTRACT

An integrated circuit memory 2 is provided with an array of memory cells 4 and power supply circuitry 10, 12. Detected operating errors in malfunctioning memory cells 14 are identified using a built-in-self-test controller 34. The power supply circuitry 10, 12 is then configured to alter the voltage supply to the malfunctioning memory cells 14 in an attempt to correct their operation. The voltage supply of the row containing the malfunctioning memory cell and the column containing the malfunctioning memory cell may both be altered. The voltage alteration may be an increase or a decrease in voltage supply depending upon the nature of the malfunction detected.

20 Claims, 4 Drawing Sheets

INTEGRATED CIRCUIT MEMORY POWER SUPPLY

BACKGROUND OF THE INVENTION

1. Field of the Invention

This invention relates to the field of integrated circuit memories. More particularly, this invention relates to power supply mechanisms used within such integrated circuit memories.

2. Description of the Prior Art

It is known to provide integrated circuit memories comprising an array of memory cells and power supply circuitry connected to the array to provide a voltage source to the memory cells within the array. Typically, each memory cell will be supplied with electrical power via a power rail at $V_{dd}$ and a power rail at ground. In some memories it is known to alter the voltage difference between the different power supply rails in order, for example, to save electrical power.

It is also known within the field of integrated circuit memories to use increasingly small device geometries for forming the different components of the memory. For example, it is now becoming common to use process geometries of a 45 nm size. While the use of such small geometries improves the component density and generally reduces power consumption and cost, it has the disadvantage of being more susceptible to process variation whereby variations in the characteristics of individual devices away from their ideal design characteristics causes them to no longer operate as intended. The increased likelihood of such malfunctioning devices arising within an integrated circuit memory tends to reduce the manufacturing yield of correctly operating memories and accordingly increase the cost of such correctly operating memories.

It is desirable to provide integrated circuit memories which are more robust against manufacturing variation.

SUMMARY OF THE INVENTION

Viewed from one aspect the present invention provides an integrated circuit memory comprising:

an array of memory cells; and power supply circuitry coupled to said array to provide a voltage source to said array; wherein said power supply circuitry is configured in response to a detected operating error in a malfunctioning memory cell of said array to select at least one group of memory cells within said array and including said malfunctioning memory cell and to alter a voltage supply to at least part of respective memory cells within said at least one group of memory cells.

The present invention recognises that it is possible to alter the voltage supply to at least part of a malfunctioning memory cell and thereby sometimes cure the malfunctioning behaviour. For example, a malfunctioning memory cell may be operating too slowly and may have its speed of operation increased to within acceptable limits by an increase in the voltage supply to that memory cell. Another example form of malfunction may be a mismatch between the gates forming a memory cell resulting in incorrect operation. Such a mismatch may be overcome by altering the voltage supply to one portion of the memory cell so as to rebalance the characteristics of the memory cell in a manner which can overcome the malfunction. It will be appreciated that the granularity with which the voltage supply may be manipulated is at the level of groups of memory cells as it would generally incur too much overhead if mechanisms were used that enabled voltage supply to be manipulated on a cell-by-cell basis. Generally speaking the present technique recognises that adjusting the voltage supply of a group of memory cells including a malfunctioning memory cell may overcome the problem with the malfunctioning memory cell while not pushing the remaining correctly functioning memory cells too far from their normal operating conditions in a manner which would cause these other memory cells to themselves malfunction or to function at an excessively disadvantageous level of performance (e.g. power consumption, speed etc).

While it is possible that the groups of memory cells could take a variety of different forms (e.g. islands of memory cells comprising a two-dimensional array sharing a common power supply mechanism), a form well suited to practical implementation is one in which at least one group of memory cells is a column of memory cells including the malfunctioning memory cell (or multiple malfunctioning memory cells). Thus, the voltage supply for a column of memory cells within an array of memory cells may be manipulated to overcome a malfunction within a memory cell within that column.

In a similar way, a row of memory cells may be subject to voltage supply manipulation to cure a malfunction within a memory cell within that array.

It is also possible to combine the above techniques whereby a malfunctioning memory cell which is a member both of a column of memory cells and a row of memory cells within an array has its voltage supply adjusted by adjusting the voltage supply of both the row in which it is located and the column in which it is located. The malfunctioning memory cell is at the intersection of the row and column with the altered voltage supplies and thus is subject to the combined effect of the alterations in voltage supply made to both the row and the column. The other non-malfunctioning memory cells that are present within the row and columns with the altered voltage supplies are only subjected to the voltage supply alteration made to either the column or the row and are thus perturbed less from their originally intended voltage supply thereby reducing the degradation in their performance. As an example, the column could have the potential of the ground rail altered and the row could have the potential of the $V_{dd}$ rail altered. A malfunctioning memory cell at the intersection of the row and column would be subject to the combined effect of both the ground rail voltage change and the $V_{dd}$ rail voltage change.

It will be appreciated that the alteration in the voltage supply could be an increase in the magnitude of voltage supply or a decrease in the magnitude of the voltage supply depending upon the nature of the malfunction detected and/or the nature of the memory cell.

It will be appreciated that an individual array of memory cells may contain multiple malfunctioning memory cells and it is possible to alter the voltage supply of the groups of memory cells containing these multiple malfunctioning memory cells so as to correct multiple instances of malfunctioning memory cells.

A common form of memory cell is one which includes a pair of transistor stacks forming cross-coupled inverter circuits to provide bit retention. Within the context of such memory cells, the power supply circuitry may be formed to give a separately selectable voltage supply to each of the pair of transistor stacks. The voltage supply to each transistor stack may be altered to correct for mismatches between the transistor stacks when an error is detected relating to one of the transistor stacks (it will be appreciated that in the case of a mismatch the alteration may be performed on either the incorrectly formed transistor stack or the correctly formed transistor stack providing they are brought back into an appropriate balance).

It is also possible that a timing error effecting both transistor stacks may be detected and in this case the voltages applied to both of the transistor stacks may be altered to address the timing error (e.g. if the transistor stacks are too slow then the voltage supply to both may be increased in order to speed up their alteration).

As previously mentioned, the voltage supply may be conveniently altered by manipulating one or both of the ground supply or non-ground supply, such as selectively coupling the memory cell to supply rails having different voltage potentials.

In this context it is convenient to manipulate the ground supply of a column of memory cells and manipulate the $V_{dd}$ supply of a row of memory cells as conventional memory arrays are provided such that the power supplies are shared in this manner.

The detection of operating errors in memory cells can be performed in a variety of different ways. The detection can be performed at manufacture as part of the manufacturing test. The detection could also, or alternatively, be performed during in-field use as part of normal operation, e.g. a memory test for malfunctioning memory cells could be performed periodically or at each boot. When the malfunctioning memory cells have been detected, the power supply circuitry may be configured to alter the voltage supply to the malfunctioning memory cells to address their malfunction, e.g. a configuration register specifying which rows and columns should have altered voltage supplies may be programmed after the detection has been performed in order to target the malfunctioning memory cells whilst leaving the remaining memory cells operating at their normal voltage supply.

The detection may be conveniently performed by self-test circuitry coupled to the array which performs one or more self-test operations upon the array. As an example a build-in-self-test (BIST) unit which normally tests a memory for correct operation by performing a sequence of access operations may detect malfunctioning memory cells, configure the power supply to alter the voltage supply to those malfunctioning memory cells and re-test in order to check that the malfunction(s) has been overcome.

Viewed from another aspect the present invention provides an integrated circuit memory comprising:

an array of memory cell means; and power supply means for providing a voltage source to said array; wherein said power supply means is responsive to a detected operating error in a malfunctioning memory cell of said array to select at least one group of memory cells within said array and including said malfunctioning memory cell and to alter a voltage supply to at least part of respective memory cell means within said at least one group of memory cell means.

Viewed from a further aspect the present invention provides a method of operating an integrated circuit memory having an array of memory cells and power supply circuitry coupled to said array to provide a voltage source to said array, said method comprising the steps of:

detecting an operating error in a malfunctioning memory cell of said array;

selecting at least one group of memory cells extending through said array and including said malfunctioning memory cell; and altering a voltage supply to at least part of respective memory cells within said at least one group of memory cells.

It will be appreciated that the above technique of voltage supply alteration of groups of memory cells to address malfunctioning operation may be combined with one or more other techniques for repairing defective memory cells, such as the provision of redundant rows and columns. As an example, a malfunctioning memory cell may be subject to an alteration of its voltage supply in attempt to overcome that malfunction, but if this is not successful, the row or column containing that malfunctioning memory cell may be replaced with one of the redundant row or columns and memory cells in order to restore correct operation of the integrated circuit memory. First attempting to correct malfunctioning memory cells by voltage supply alteration enables robustness to be improved with a reduced number of redundant rows or columns thereby reducing cost, power consumption, size etc.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
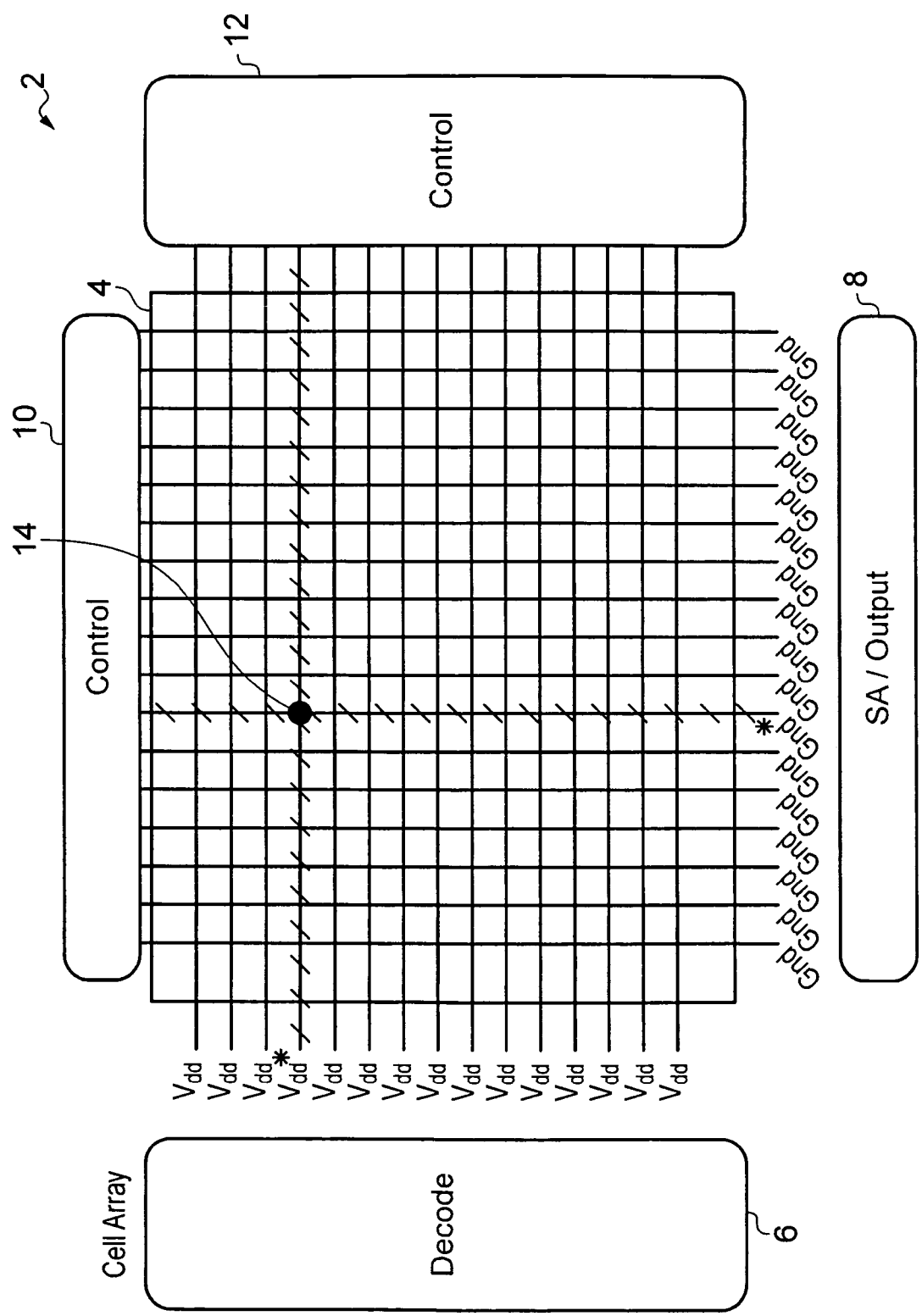
FIG. 1 schematically illustrates an integrated circuit memory including an array of memory cells within which there is located a malfunctioning memory cell.

FIG. 1 shows an integrated circuit memory 2 including an array of memory cells 4. An address decoder 6 is used to decode an input memory address and activate for access a row of memory cells within the array 4. Sense amplifier output circuitry 8 is used to read bit values from a selected row of memory cells. Power supply circuitry 10, 12 coupled to the array 4 supplies both the ground rail voltage GND to the memory cells on a column-by-column basis and the non-ground voltage $V_{DD}$ to the memory cells on a row-by-row basis. The GND supply is shown routed vertically and the $V_{DD}$ supply routed horizontally, but it will be appreciated that other orientations and combinations are possible, e.g. in many designs GND runs horizontally and $V_{DD}$ runs vertically.

The array 4 contains a malfunctioning memory cell 14. This malfunctioning memory cell 14 may be detected by a BIST circuit or in some other way. The detection may be performed as part of the manufacturing test and/or in-field as part of normal operation. The malfunction of the malfunctioning memory cell 14 may be addressed by altering the voltage supply to the malfunctioning memory cell 14. In the example illustrated, the power supply circuitry 10 alters the ground supply voltage potential for the column of memory cells containing the malfunctioning memory cell 14. The power supply circuitry 12 alters the non-ground supply voltage $V_{dd}$ to the row of memory cells containing the malfunctioning memory cell 14. The malfunctioning memory cell 14 is subject to the alteration in its voltage supply brought about by the combined affect of the alteration within the row of memory cells and the alteration within the column of memory cells. The remaining memory cells within the altered row or column are subject to a lower level of voltage supply alteration as they do not form part of both the altered column and the altered row. This reduces the perturbation of the normal supply voltage incurred in the attempt to correct the operation of the malfunctioning memory cell 14 in respect of the memory cells within the same row or column which are not malfunctioning.

Figure 2:
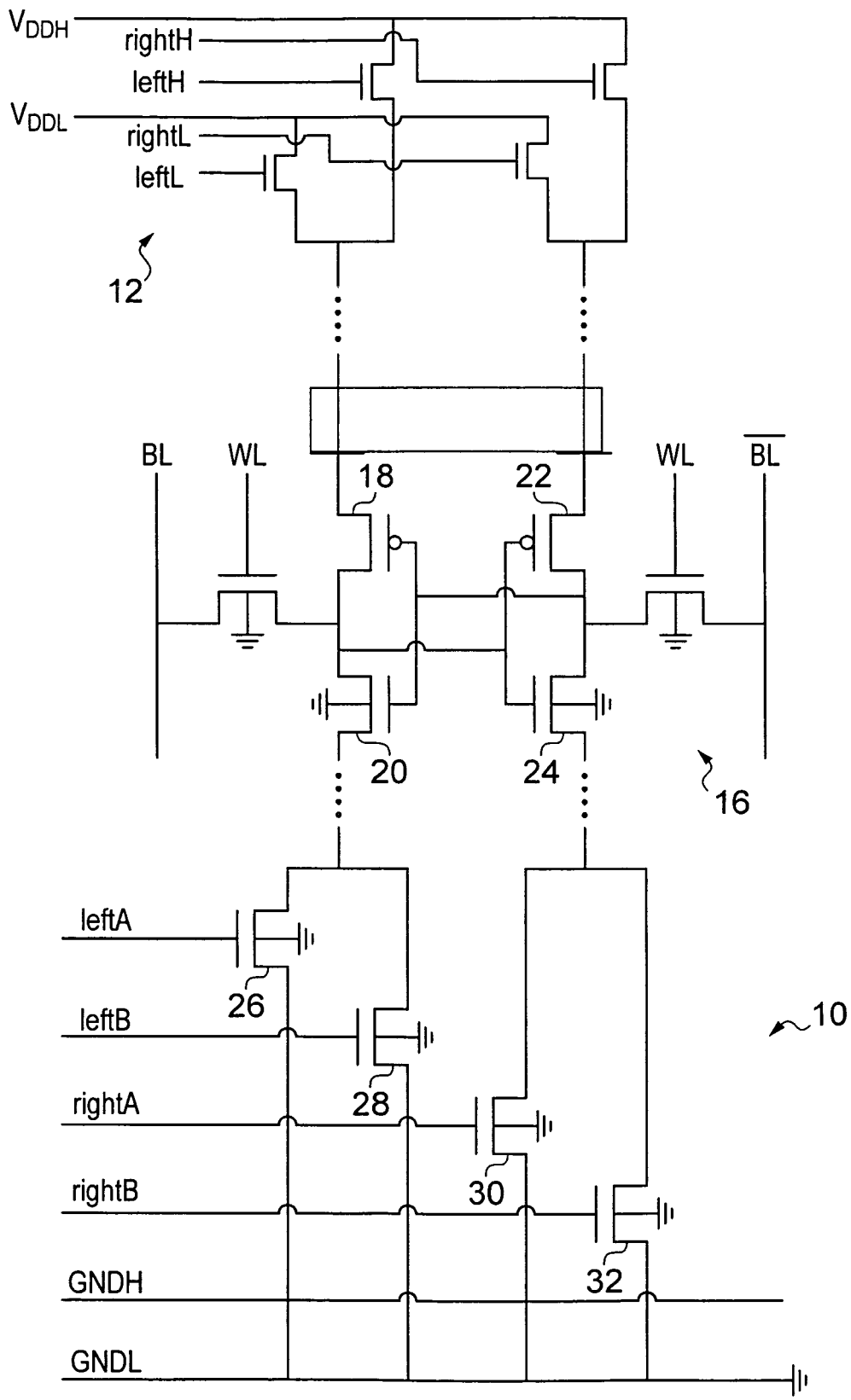
FIG. 2 schematically illustrates a memory cell and power supply circuitry configured such that the voltage supply may be altered.

FIG. 2 schematically illustrates a memory cell 16 which may be a member of the array 4. In this example the memory cell 16 is a six transistor (6T) memory cell of conventional form. The power supply circuitry 10 supplying the ground potential to the memory cell 16 can couple the memory cell 16 to either a high level ground GNDH or a low level ground GNDL. The memory cell 16 contains a first transistor stack formed of gates 18, 20 and a second transistor stack formed of gates 22, 24. Together these gates 18, 20, 22 and 24 form cross-coupled inverters serving to provide bit retention. The ground voltages supplied to these different transistor stacks may be separately selected as either GNDH or GNDL under action of the signals in respect of the left stack or the right stack switching the transistors 26, 28, 30 and 32. If the error is the result of a mismatch between the transistor stack 18, 20, 22 and 24, then the voltage supply to one of the transistor stacks may be altered while the other is not altered. This may correct the mismatch and cure the malfunction. As part of the test operation, alteration of either of the stack voltages may be tested to see if it cures the malfunction. It is also possible that an attempt could be made to correct the malfunction by altering the voltage supply of both of the transistor stacks. Altering the supply voltage of both of the transistor stacks would be one way of addressing a timing malfunction.

Also illustrated in FIG. 2 is the power supply circuitry 12 which serves to manipulate the non-ground supply voltage $V_{dd}$ applied to the transistor stacks 18, 20, 22, 24. Again two voltage potential levels are provided and may be separately selected for supply to different portions of the memory cell 16. An individual memory cell 16 may be subject to variation of one or both of its $V_{dd}$ voltage level and its ground voltage level.

The $V_{dd}$ voltages are supplied by power supply rails running along rows of memory cells. The ground voltage levels are provided by rails running along columns of memory cells.

Figure 3:
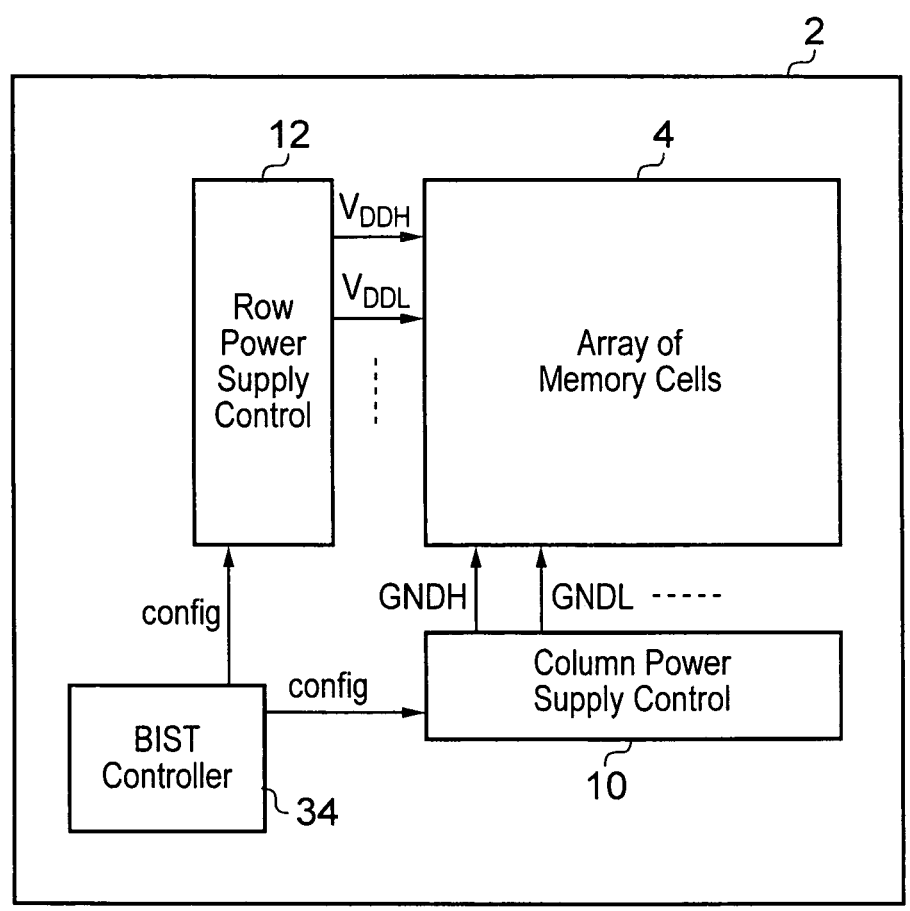
FIG. 3 schematically illustrates an integrated circuit memory including power supply control circuitry configured by a BIST controller.

FIG. 3 illustrates an integrated circuit memory 2 including an array of memory cells 4, a row power supply 12 and a column power supply 10. These may be as previously described. A BIST controller 34 is provided to run self-tests upon the memory cells within the array 4 to detect malfunctioning of memory cells. These self-tests may take the form of writing particular patterns of data values within the memory cells and then reading back those patterns to ensure that they were correctly stored and read. These techniques will be familiar to those in this technical field. When a malfunctioning memory cell is detected, the BIST controller 34 sends configuration data to one or both of the row power supply 12 and the column power supply 10 to adjust voltage supply of the row and column respectively containing the malfunctioning memory cell in an attempt to cure the malfunction. Different configurations and alterations of supply voltage may be attempted and the self-test rerun to determine whether or not correct operation has been restored. If a particular configuration does cure the malfunction, then that configuration may be retained within the row power supply 12 and/or the column power supply 10 and used during continued operation of the array 4 to preserve correct operation. The alteration of the voltage supply to correct malfunctioning memory cells may be combined with other error correction techniques, such as the use of the redundant rows and columns etc. The self-test operations performed by the BIST controller 34 may be performed as part of manufacturing test and/or in-field as part of normal operation.

Figure 4:
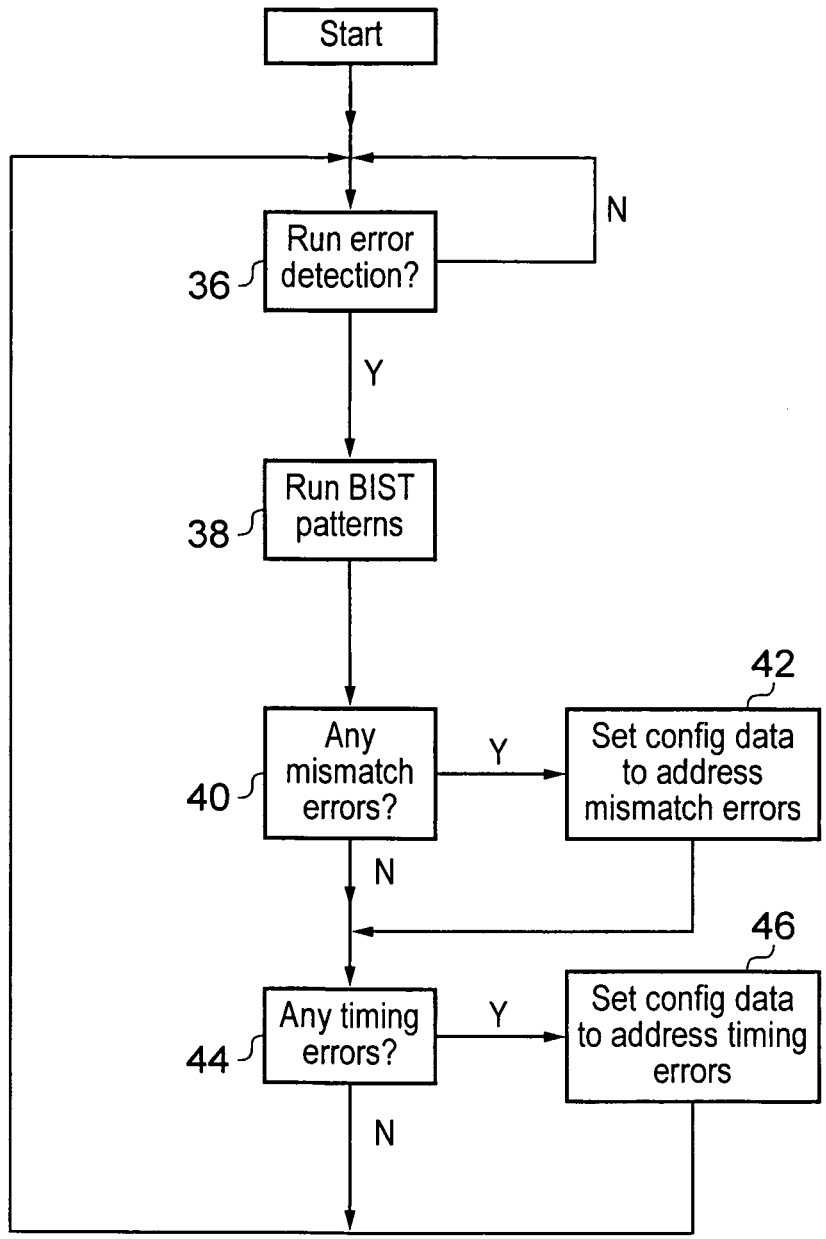
FIG. 4 is a flow diagram schematically illustrating the operation of the present techniques.

FIG. 4 is a flow diagram schematically illustrating the operations previously described. At step 36, processing waits until an appropriate time to run error detection is encountered. At step 38 the BIST controller 34 runs the BIST test patterns within the array 4 to detect any malfunctioning memory cells 14. Step 40 determines whether the nature of the malfunction detected indicates a mismatch error within the malfunctioning memory cell. If a mismatch error is detected, then processing proceeds to step 42 at which the configuration data for the row power supply 12 and the column power supply 10 is set to address such a mismatch error (this could be a voltage supply increase, voltage supply decrease or a combination of both applied to different transistor stacks within the malfunctioning memory cell 14). Step 44 determines whether any timing errors were detected as part of the malfunctioning memory cells identified. If there are such timing errors detected, then step 46 serves to set the configuration data to the row power supply 12 and the column power supply 10 to address the timing errors (e.g. altering the power supply levels of both transistor stacks in order to try to meet the required timing constraints).

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit memory comprising:
an array of memory cells; and
power supply circuitry coupled to said array to provide a voltage source to said array; wherein
said power supply circuitry is configured to respond to a detected operating error in a malfunctioning memory cell of said array and to select at least one group of memory cells within said array, said group including said malfunctioning memory cell, and to alter, in response to said detected operating error, a voltage supply voltage to a source or drain terminal of at least one transistor of respective memory cells within said at least one group of memory cells to a voltage level at which said malfunctioning memory cell continues to operate, and to retain the altered voltage supply voltage during continued operation of the array to overcome said detected operating error.

2. An integrated circuit memory as claimed in claim 1, wherein said at least one group comprises a column of memory cells including said malfunctioning memory cell.

3. An integrated circuit memory as claimed in claim 1, wherein said at least one group comprises a row of memory cells including said malfunctioning memory cell.

4. An integrated circuit memory as claimed in claim 1, wherein said at least one group comprises two groups forming a column of memory cells including said malfunctioning memory cell and a row of memory cells including said malfunctioning memory cell such that said malfunctioning memory cells is located at an intersection of said row and said column.

5. An integrated circuit memory as claimed in claim 1, wherein array includes a plurality of malfunctioning memory cells and said power supply circuitry is configured to alter said voltage supply to a plurality of groups of memory cells such that at least part of each of said plurality of malfunctioning memory cells receives an altered voltage supply.

6. An integrated circuit memory as claimed in claim 1, wherein each of said memory cells includes a pair of transistor stacks forming cross-coupled inverter circuits to provide bit retention; and said power supply circuitry supplies a power supply having a separately selectable voltage supply to each of said pair of transistor stacks.

7. An integrated circuit memory as claimed in claim 6, wherein when said detected error relates to a first of said pair of transistor stacks with a second of said pair of transistor stacks not having a detected error, then said power supply circuitry supplies an altered voltage supply to said first of said pair of transistor stacks and not to said second of said pair of transistor stacks.

8. An integrated circuit memory as claimed in claim 7, wherein said detected error is a mismatch error between said pair of transistor stacks.

9. An integrated circuit memory as claimed in claim 6, wherein when said detected error relates to both of said pair of transistor stacks, then said power supply circuitry supplies an altered voltage supply to both of said pair of transistor stacks.

10. An integrated circuit memory as claimed in claim 9, wherein said detected error is a timing error of said malfunctioning memory cell.

11. An integrated circuit memory as claimed in claim 1, wherein said power supply circuitry selectively couples one of said at least one group of memory cells including said malfunctioning cell to either a first ground supply rail or a second ground supply rail, said first ground supply rail having a different voltage potential from said second ground supply rail.

12. An integrated circuit memory as claimed in claim 11, wherein said one of said at least one group of memory cells is a column of memory cells.

13. An integrated circuit memory as claimed in claim 1, wherein said power supply circuitry selectively couples one of said at least one group of memory cells including said malfunctioning cell to either a first non-ground supply rail or a second non-ground supply rail, said first non-ground supply rail having a different voltage potential from said second non-ground supply rail.

14. An integrated circuit memory as claimed in claim 13, wherein said one of said at least one group of memory cells is a row of memory cells.

15. An integrated circuit memory as claimed in claim 1, comprising self-test circuitry coupled to said array to perform one or more self-test operations upon said array, said malfunctioning memory cell being detected as part of said one or more self-test operations, said self-test circuitry serving to configure said power supply circuitry to select said at least one group of memory cells.

16. An integrated circuit memory as claimed in claim 1, wherein said operating error is detected during manufacturing test of said integrated circuit memory and said power supply circuitry is configured as part of manufacture.

17. An integrated circuit memory as claimed in claim 1, wherein said operating error is detected during in-field operational testing of said integrated circuit memory and said power supply circuitry is configured as part of in-field operation.

18. An integrated circuit memory comprising:

an array of memory cells; and power supply means for providing a voltage source to said array; wherein said power supply means is responsive to a detected operating error in a malfunctioning memory cell of said array and selecting at least one group of memory cells within said array, said group including said malfunctioning memory cell, said power supply means altering, in response to said detected operating error, the voltage of said voltage source to a source or drain terminal of at least one transistor of respective memory cells within said at least one group of memory cells to a voltage level at which said malfunctioning memory cell continues to operate and retaining the altered voltage during continued operation of the array to overcome said detected operating error.

19. A method of operating an integrated circuit memory having an array of memory cells and power supply circuitry coupled to said array to provide a voltage source to said array, said method comprising the steps of:

detecting an operating error in a malfunctioning memory cell of said array;

selecting at least one group of memory cells extending through said array, said group including said malfunctioning memory cell; and altering, in response to said detected operating error, the voltage of a voltage supply to a source or drain terminal of at least one transistor of respective memory cells within said at least one group of memory cells to a voltage level at which said malfunctioning memory cell continues to operate and retaining the altered voltage during said continued operation of the array to overcome said operating error.

20. An integrated circuit memory as claimed in claim 1, wherein said power supply circuitry is configured to alter said voltage supply voltage of said respective memory cells within said at least one group of memory cells while remaining memory cells are subject to a lower level of voltage supply alteration.

* * * * *